US006639283B1

United States Patent
Hung et al.

(10) Patent No.: US 6,639,283 B1
(45) Date of Patent: Oct. 28, 2003

(54) SEMICONDUCTOR DEVICE WITH SUBSTRATE-TRIGGERED ESD PROTECTION

(75) Inventors: Kei-Kang Hung, Changhua (TW); Ming-Dou Ker, Hsin Chu (TW)

(73) Assignee: Faraday Technology Corp. (TW)

( * ) Notice: Subject to any disclaimer, the term of this patent is extended or adjusted under 35 U.S.C. 154(b) by 0 days.

(21) Appl. No.: 10/117,147

(22) Filed: Apr. 4, 2002

(51) Int. Cl.$^7$ .............................................. H01L 23/62
(52) U.S. Cl. ..................... 257/355; 257/173; 257/356; 257/360; 257/361; 257/362; 257/363
(58) Field of Search .................... 257/202, 909, 257/494–495, 127, 170, 409, 484, 609, 173–174, 355–363

(56) References Cited

U.S. PATENT DOCUMENTS

| | | | | |
|---|---|---|---|---|
| 4,786,613 A | * | 11/1988 | Gould et al. ................. | 438/129 |
| 6,097,066 A | * | 8/2000 | Lee et al. .................... | 257/355 |
| 6,329,694 B1 | * | 12/2001 | Lee et al. .................... | 257/372 |
| 6,399,990 B1 | * | 6/2002 | Brennan et al. ............ | 257/355 |
| 6,465,768 B1 | * | 10/2002 | Ker et al. ................. | 250/214.1 |
| 6,521,952 B1 | * | 2/2003 | Ker et al. ................... | 257/360 |
| 2002/0084491 A1 | * | 7/2002 | Lee et al. .................... | 257/355 |
| 2002/0149059 A1 | * | 10/2002 | Ker et al. ................... | 257/355 |
| 2003/0071310 A1 | * | 4/2003 | Salling et al. .............. | 257/355 |

* cited by examiner

Primary Examiner—Amir Zarabian
Assistant Examiner—Ida M. Soward
(74) Attorney, Agent, or Firm—Martine & Penilla, LLP

(57) ABSTRACT

A semiconductor device with substrate-triggered ESD protection technique includes a guard ring, a first MOS transistor array, a second MOS transistor array and a substrate-triggered portion. The first MOS transistor array, the second MOS transistor array and the substrate-triggered portion are formed in a region surrounded by the guard ring, and the substrate-triggered portion is located between the first MOS transistor array and the second MOS transistor array. Therefore, when the ESD event occurs, the substrate-triggered portion can be used for biasing a base of at least one parasitic BJT in the first MOS transistor array and a base of at least one parasitic BJT in the second MOS transistor array to achieve uniform turn-on among the multiple fingers of MOS transistor array. By using this layout design, the MOS transistor array can have a high ESD robustness.

12 Claims, 6 Drawing Sheets

US 6,639,283 B1

SEMICONDUCTOR DEVICE WITH SUBSTRATE-TRIGGERED ESD PROTECTION

BACKGROUND OF THE INVENTION

1. Field of the Invention

The invention relates to a semiconductor device and, more particularly, to a semiconductor device with substrate-triggered electrostatic discharge (ESD) protection.

2. Description of the Related Art

The electrostatic protection is one of the important issues of the integrated circuits. Since the electrostatic charge is accompanied with a relatively high voltage (may be several thousands volts), those skilled in the art may utilize an electrostatic discharge (ESD) protection circuit to protect the semiconductor device, thereby preventing the semiconductor device from being damaged by the electrostatic charge.

Referring to FIG. 1A, a conventional semiconductor device 1 with ESD protection includes a guard ring 11 and a MOS (Metal-Oxide-Semiconductor) transistor array 12. The MOS transistor array 12 has a plurality of MOS transistors, each of which is composed of a source 121, a drain 122 and a gate 123. The circuit layout of the gate 123 is of a finger-type. As shown in FIG. 1B, a plurality of N+ diffusion areas and a plurality of P+ diffusion areas are formed on a substrate 20. The N+ diffusion areas 21 and 22 serve as the source 121 and the drain 122 shown in FIG. 1A, respectively. The P+ diffusion area 23 serves as the guard ring 11 shown in FIG. 1A. The N+ diffusion areas 21 and 22 and the substrate 20 form a parasitic bipolar junction transistor (parasitic BJT) 24. Thus, the junction between the base and the emitter of the parasitic BJT 24 is forward biased by the ESD pulse, such as of a human-body mode (HBM), in order to trigger the parasitic BJT 24 into an active region. Thus, the MOS transistor array 12 can be protected.

However, the finger-type NMOS transistors as described above cannot be uniformly triggered as expected, but only a part of the fingers are activated. The result is that the semiconductor device 1 is easily subjected to ESD damage. Therefore, even if there are more MOS fingers forming the parasitic BJT in the semiconductor device 1 to discharge the electrostatic charge, the ESD robustness of the semiconductor device 1 is still very low. In other words, since the turn-on speeds of the fingers are different from one another, the turn-on uniformity is not good. Thus, the ESD protection level of the semiconductor device does not come up to expectation.

In order to overcome the aforementioned problem, those skilled in the art may improve the turn-on uniformity of each finger by various circuit tricks. One of the most commonly used methods is to use a substrate-triggered ESD protection circuit for improving the turn-on uniformity of the MOS fingers. Referring to FIG. 2A, a conventional semiconductor device 3 with substrate-triggered ESD technique includes a guard ring 31 and a MOS transistor array 32. The MOS transistor array 32 has a plurality of MOS transistors 321, a plurality of fingers 322 constituted by the gates of the MOS transistors 321, and a plurality of substrate-triggered areas 323 between the fingers 322. As shown in FIG. 2B, a plurality of N+ diffusion areas and a plurality of P+ diffusion areas are formed on a substrate 40. Since the diffusion areas are similar to those of the aforementioned semiconductor device 1, detailed description thereof is omitted. The semiconductor device 3 is different from the aforementioned semiconductor device 1 in having a plurality of P+ diffusion areas 41 and a plurality of isolation portions 42. Each of the isolation portions 42 can be a shallow trench isolation (STI) portion for separating the P+ diffusion areas 41 from the N+ diffusion areas. Thus, when the ESD event occurs, the trigger current $I_{trig}$ flows through the P+ diffusion areas 41 to the substrate 40, and then the bases of parasitic BJTs 43 and 44 are biased. Accordingly, the parasitic BJTs 43 and 44 can be triggered simultaneously to discharge the electrostatic charge. Therefore, the turn-on uniformity of each finger can be efficiently improved.

To sum up, the turn-on uniformity of each finger can be efficiently improved by forming a substrate-triggered area between two adjacent fingers. However, since three substrate-triggered areas 323 (as shown in FIG. 2A) have to be provided for four fingers 322, these substrate-triggered areas may increase the area of the circuit layout. In other words, in each MOS transistor array, there is a large area not formed with MOS transistors. Therefore, the number of the MOS transistors in the MOS transistor array greatly decreases due to the provision of the substrate-triggered area. The manufacturing cost of the semiconductor device is thus increased.

As above, it is an important subject matter to provide the substrate-triggered area so as to improve the ESD protection ability of the semiconductor device without greatly increasing the area of the circuit layout.

SUMMARY OF THE INVENTION

In view of the aforementioned problem, it is an important object of the invention to provide a semiconductor device with substrate-triggered ESD protection technique and having a substrate-triggered area capable of improving the ESD protection ability without greatly increasing the area of the circuit layout.

To achieve this object, a semiconductor device with substrate-triggered ESD protection in accordance with one aspect of the invention includes a guard ring, a first MOS transistor array, a second MOS transistor array and a substrate-triggered portion. In the invention, the first MOS transistor array, the second MOS transistor array and the substrate-triggered portion are formed in a region surrounded by the guard ring, and the substrate-triggered portion is located between the first MOS transistor array and the second MOS transistor array. The first MOS transistor array has at least one first finger-type gate extending in a first direction. Also, the second MOS transistor array has at least one second finger-type gate extending in the first direction. The substrate-triggered portion is arranged to extend in a second direction perpendicular to the first direction. When an ESD event occurs, the substrate-triggered portion can pass a trigger current to bias a base of at least one parasitic BJT in the first MOS transistor array and a base of at least one parasitic BJT in the second MOS transistor array. As stated above, an isolation portion is further formed among the guard ring, the first MOS transistor array, the second MOS transistor array and the substrate-triggered portion.

In addition, in another aspect of the invention, the semiconductor device with substrate-triggered ESD protection further includes a first N-well and a second N-well. The first N-well and the second N-well are formed between the first MOS transistor array and the second MOS transistor array, and located near two ends of the substrate-triggered portion, respectively.

To sum up, in the semiconductor device with substrate-triggered ESD protection design in accordance with the invention, the substrate-triggered portion is formed between two MOS transistor arrays, but not formed between two fingers in one MOS transistor array. As a result, it can be used for improving the ESD protection ability of the semiconductor device without greatly increasing the area of the circuit layout with this design.

BRIEF DESCRIPTION OF THE DRAWINGS

The above-mentioned and other objects, features, and advantages of the present invention will become apparent with reference to the following detailed descriptions and accompanying drawings, wherein.

DETAILED DESCRIPTION OF THE PREFERRED EMBODIMENTS

The semiconductor device with substrate-triggered ESD protection technique in accordance with preferred embodiments of the invention will be described with reference to the accompanying drawings, wherein the same reference numbers denote the same elements.

Figure 1A:
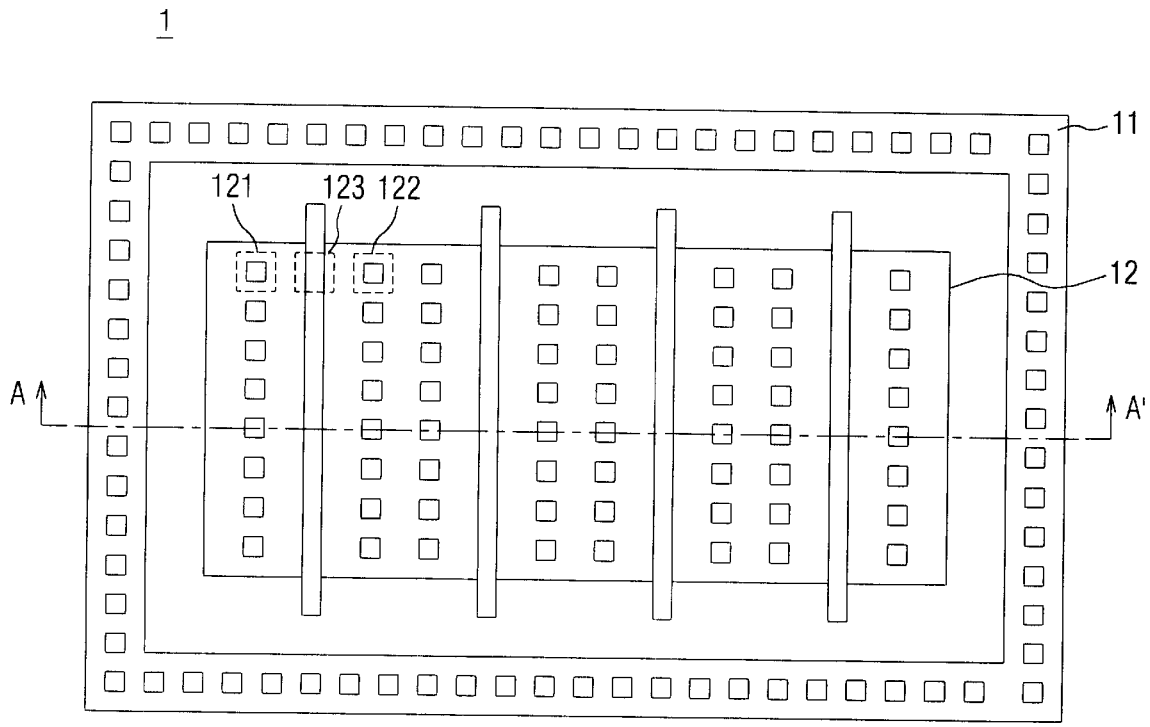
FIG. 1A is a schematic illustration showing a circuit layout of a conventional semiconductor device with ESD protection.
Figure 1B:
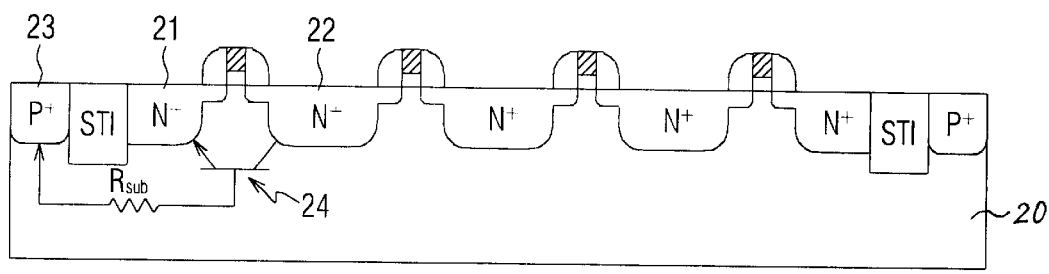
FIG. 1B is a schematic illustration showing a cross-sectional view of the semiconductor device taken along a line AA' in FIG. 1A.
Figure 2A:
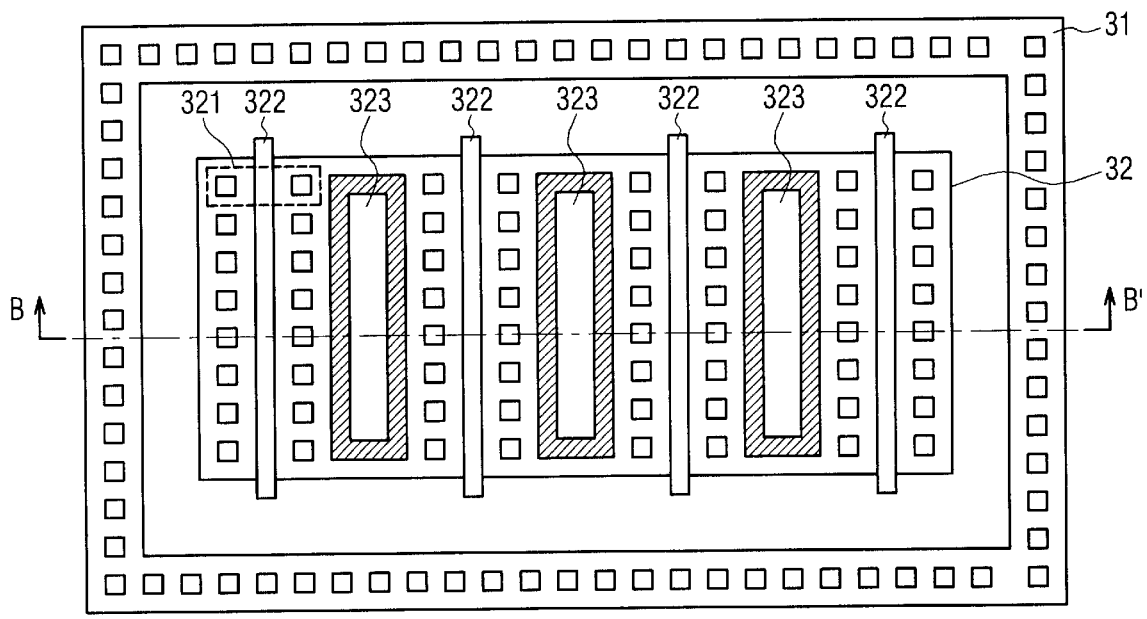
FIG. 2A is a schematic illustration showing a circuit layout of another conventional semiconductor device with substrate-triggered ESD protection.
Figure 2B:
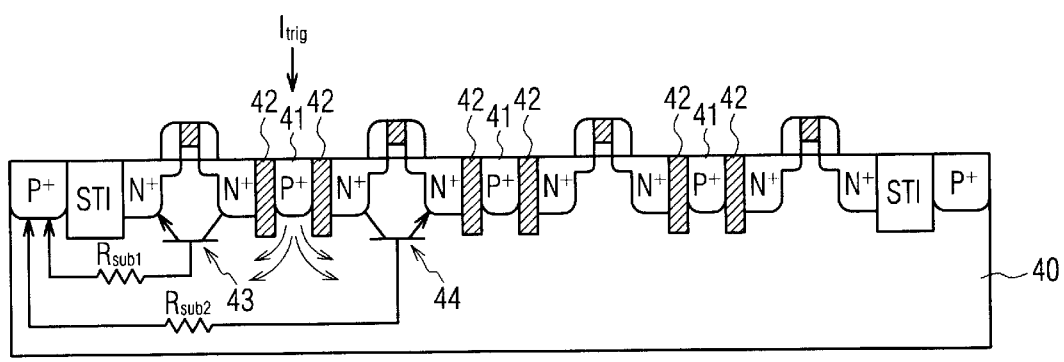
FIG. 2B is a schematic illustration showing a cross-sectional view of the semiconductor device taken along a line BB' in FIG. 2A.
Figure 3A:
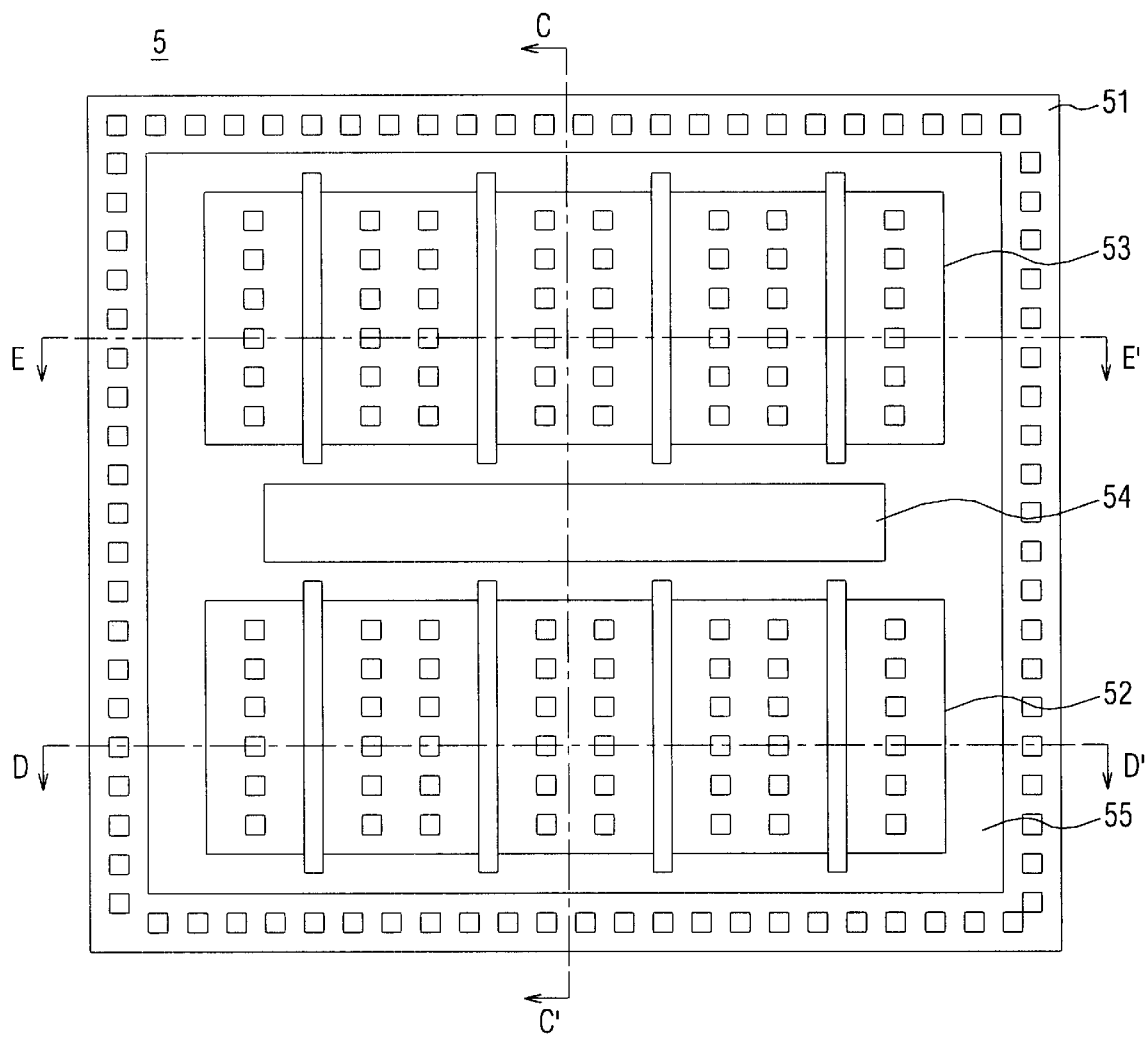
FIG. 3A is a schematic illustration showing a circuit layout of a semiconductor device with substrate-triggered ESD protection design in accordance with a preferred embodiment of the invention.

Referring to FIG. 3A, a semiconductor device 5 with substrate-triggered ESD protection technique in accordance with a preferred embodiment of the invention includes a guard ring 51, a first MOS transistor array 52, a second MOS transistor array 53, a substrate-triggered portion 54 and an isolation portion 55.

In this embodiment, the first MOS transistor array 52, the second MOS transistor array 53, the substrate-triggered portion 54 and the isolation portion 55 are formed in a region surrounded by the guard ring 51. The substrate-triggered portion 54 is located between the first MOS transistor array 52 and the second MOS transistor array 53. In addition, the isolation portion 55 is formed among the guard ring 51, the first MOS transistor array 52, the second MOS transistor array 53 and the substrate-triggered portion 54 so as to separate these regions.

Figure 3B:
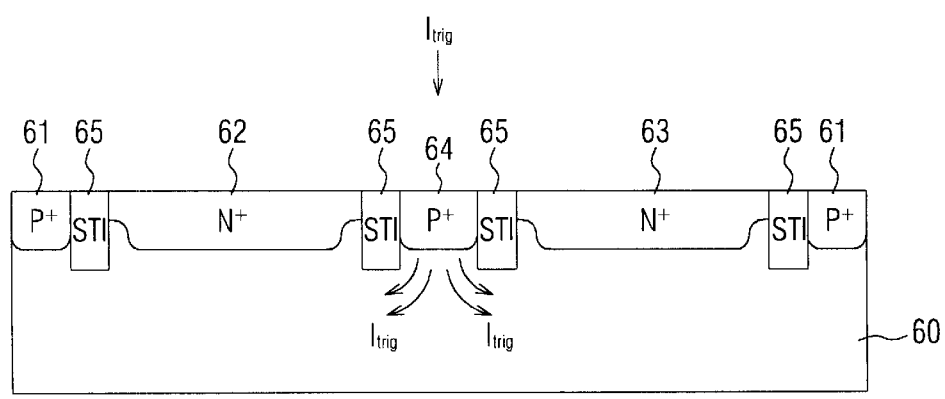
FIG. 3B is a schematic illustration showing a cross-sectional view of the semiconductor device taken along a line CC' in FIG. 3A.

As shown in FIG. 3B, the guard ring 51 is formed on a P$^+$ diffusion area 61 of a substrate 60. In addition, the first MOS transistor array 52, the second MOS transistor array 53, the substrate-triggered portion 54 and the isolation portion 55 can be an N$^+$ diffusion area 62, an N$^+$ diffusion area 63, a P$^+$ diffusion area 64 and a shallow trench isolation (STI) portion 65 formed on the substrate 60, respectively. It is obvious from FIG. 3B that the shallow trench isolation portion 65 isolates the N$^+$ diffusion area 62, the N$^+$ diffusion area 63 and the P$^+$ diffusion area 64 from one another.

Figure 3C:
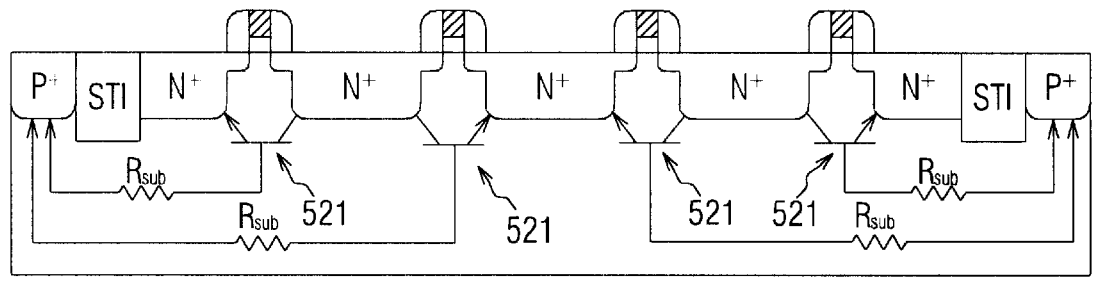
FIG. 3C is a schematic illustration showing a cross-sectional view of the semiconductor device taken along a line DD' in FIG. 3A.
Figure 3D:
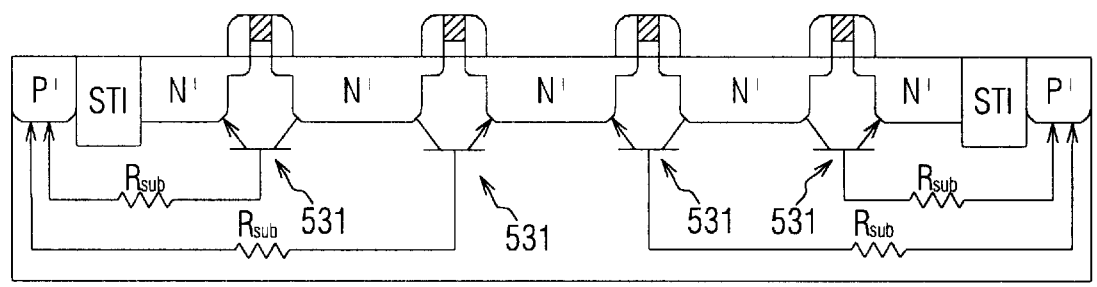
FIG. 3D is a schematic illustration showing a cross-sectional view of the semiconductor device taken along a line EE' in FIG. 3A.

As stated above, the first MOS transistor array 52 and the second MOS transistor array 53 include a first parasitic BJT 521 (as shown in FIG. 3C) and a second parasitic BJT 531 (as shown in FIG. 3D), respectively. When the ESD event occurs, the trigger current $I_{trig}$ can flow through the P$^+$ diffusion area 64 to the P$^+$ diffusion area 61 serving as the guard ring 51, so as to produce a voltage drop. The voltage drop is the product of the trigger current $I_{trig}$ and the substrate resistor $R_{sub}$, and is capable of forward-biasing the base-emitter junctions of the parasitic BJTs 521 and 531 into active states, so as to enable the parasitic BJTs to discharge the electrostatic charge. It should be noted that the MOS transistors in the first MOS transistor array 52 and the second MOS transistor array 53 can be NMOS transistors or PMOS transistors.

It should be noted that the first parasitic BJT 521 and the second parasitic BJT 531 shown in FIGS. 3C and 3D are merely schematic illustrations. In this embodiment, the direction from the collector to the emitter of the parasitic BJTs (i.e., the direction from the source to the drain of each MOS transistor) is parallel to lines DD' and EE' (as shown in FIG. 3A). On the other hand, the direction of the trigger current $I_{trig}$ flowing through the substrate-triggered portion 54 to the P$^+$ diffusion area 61 is parallel to a line CC' (as shown in FIG. 3A). In addition, the first parasitic BJT 521 can be widely referred to all parasitic BJTs in the first MOS transistor array 52, while the second parasitic BJT 531 can be widely referred to all parasitic BJTs in the second MOS transistor array 53.

Figure 4:
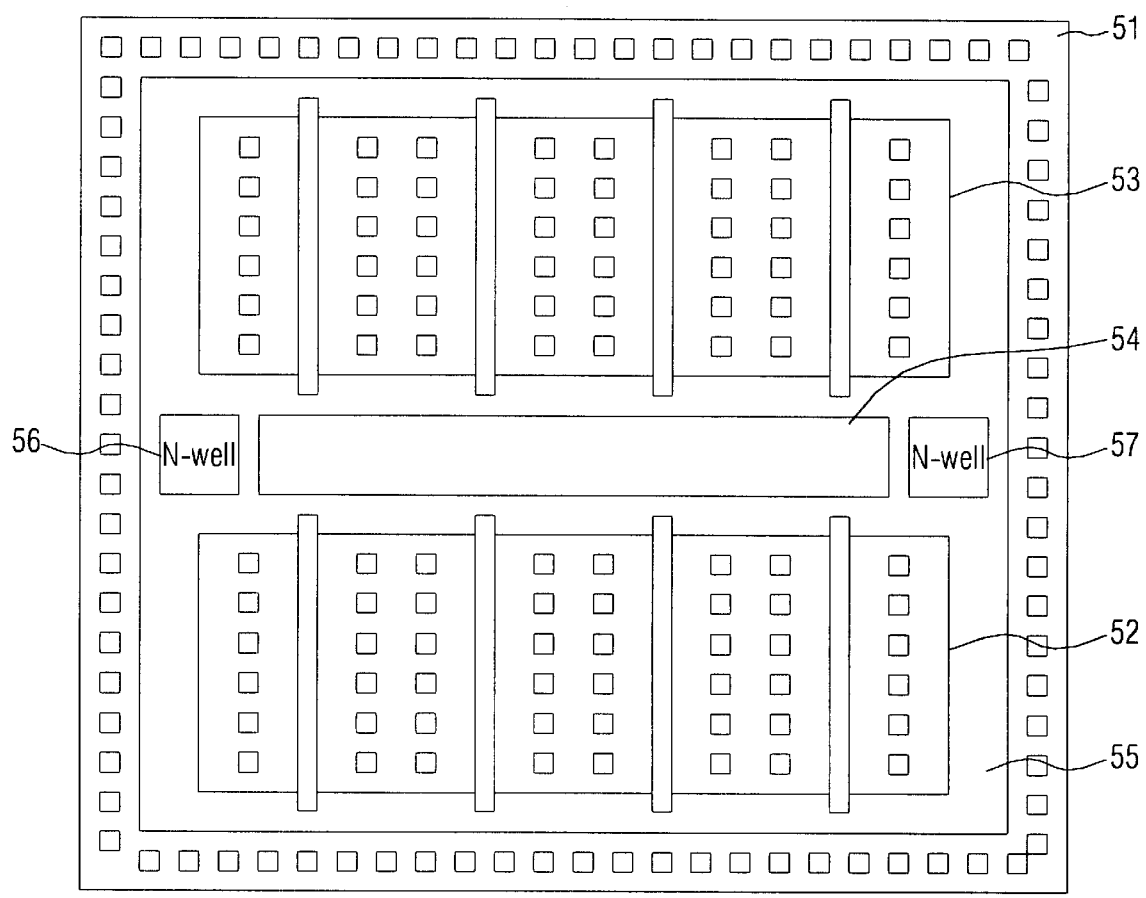
FIG. 4 is a schematic illustration showing a circuit layout of a semiconductor device with substrate-triggered ESD protection design in accordance with another preferred embodiment of the invention.

Referring to FIG. 4, a semiconductor device 7 with substrate-triggered ESD protection design in accordance with another preferred embodiment of the invention further includes a first N-well 56 and a second N-well 57. In this embodiment, the first N-well 56 and the second N-well 57 are formed between the first MOS transistor array 52 and the second MOS transistor array 53, and are located near two ends of the substrate-triggered portion 54, respectively. Since the first N-well 56 and the second N-well 57 are N diffusion areas that are deeply diffused into the substrate, and the substrate-triggered portion 54 is a P$^+$ diffusion area, when the ESD event occurs, the trigger current flows from the substrate-triggered portion 54 to the substrate. At this time, due to the blocking effects of the first N-well 56 and the second N-well 57, the trigger current components toward the first N-well 56 and the second N-well 57 decrease. Consequently, the trigger current components toward the first MOS transistor array 52 and the second MOS transistor array 53 correspondingly increase. In this case, since the trigger current can efficiently bias the bases of the parasitic BJTs in the first MOS transistor array 52 and the second MOS transistor array 53, the ESD protection ability of the semiconductor device 7 can be efficiently improved without greatly increasing the circuit layout area.

Figure 5:
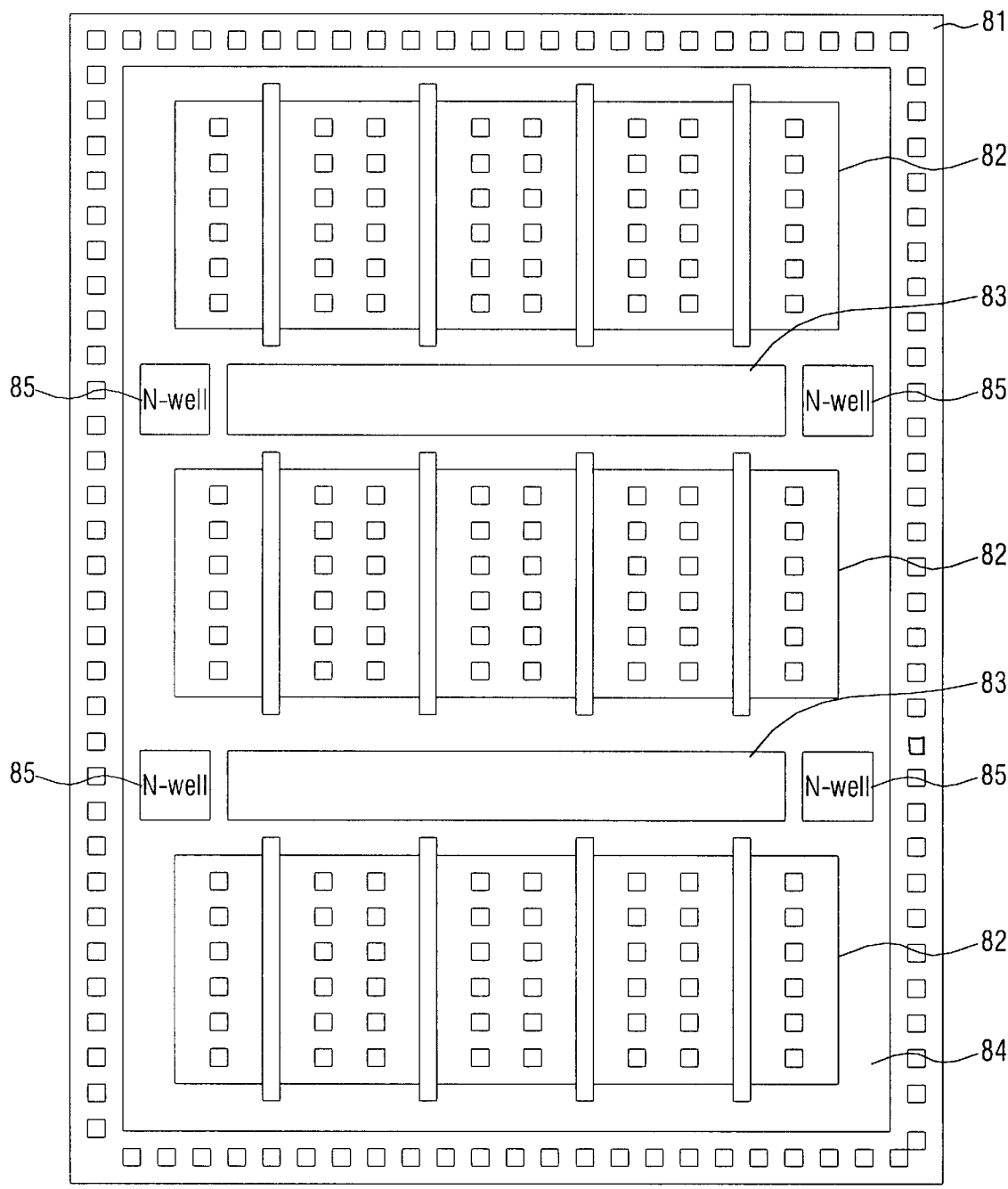
FIG. 5 is a schematic illustration showing a circuit layout of a semiconductor device with substrate-triggered ESD protection design in accordance with another preferred embodiment of the invention.

It should be noted that the semiconductor device 5 and 7 mentioned above might include three (or more than three) MOS transistor arrays, two (or more than two) substrate-triggered portions and N-wells formed in a region surrounded by the guard ring 51. As shown in FIG. 5, for example, a semiconductor device 8 with substrate-triggered ESD protection design in accordance with another preferred embodiment of the invention includes a guard ring 81, three MOS transistor arrays 82, two substrate-triggered portions 83, an isolation portion 84 and four N-wells 85. The N-wells are formed near both ends of the substrate-triggered portions 83. These elements of the semiconductor device 8 are as described hereinbefore. Those skilled in the art should know that the number of MOS transistor arrays, substrate-triggered portions and N-wells could be designed depending on the requirements of producers.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A semiconductor device with substrate-triggered electrostatic discharge (ESD) protection, comprising:
   a guard ring formed in a substrate for surrounding a region;
   a first metal-oxide-semiconductor (MOS) transistor array formed in said region and having at least one first finger-type gate extending in a first direction;
   a second MOS transistor array formed in said region and having at least one second finger-type gate extending in said first direction; and
   a substrate-triggered portion formed in said region and between said first MOS transistor array and said second MOS transistor array, and arranged to extend in a second direction perpendicular to said first direction, for passing a trigger current through said substrate simultaneously to both of said first and second MOS transistor arrays when an ESD event occurs, so as to bias a base of at least one parasitic bipolar junction transistor (BJT) in said first MOS transistor array and a base of at least one parasitic BJT in said second MOS transistor array.

2. The semiconductor device with substrate-triggered ESD protection according to claim 1, further comprising:
   an isolation portion formed among said guard ring, said first MOS transistor array, said second MOS transistor array, and said substrate-triggered portion.

3. The semiconductor device with substrate-triggered ESD protection according to claim 2, wherein said isolation portion is a shallow trench isolation (STI) portion.

4. The semiconductor device with substrate-triggered ESD protection according to claim 1, wherein MOS transistors in said first MOS transistor array and said second MOS transistor array are NMOS transistors.

5. The semiconductor device with substrate-triggered ESD protection according to claim 1, wherein MOS transistors in said first MOS transistor array and said second MOS transistor array are PMOS transistors.

6. The semiconductor device with substrate-triggered ESD protection according to claim 1, wherein said substrate-triggered portion is a $P^+$ diffusion area.

7. The semiconductor device with substrate-triggered ESD protection according to claim 1, further comprising:
   a first N-well formed in said region and between said first MOS transistor array and said second MOS transistor array, and located near one end of said substrate-triggered portion for blocking said trigger current in order to increase a component of said trigger current toward said first and second MOS transistor arrays.

8. The semiconductor device with substrate-triggered ESD protection according to claim 7, further comprising:
   an isolation portion formed among said guard ring, said first MOS transistor array, said second MOS transistor array, said substrate-triggered portion and said first N-well.

9. The semiconductor device with substrate-triggered ESD protection according to claim 8, wherein said isolation portion is an STI portion.

10. The semiconductor device with substrate-triggered ESD protection according to claim 7, further comprising:
    a second N-well formed in said region and between said first MOS transistor array and said second MOS transistor array, and located near another end of said substrate-triggered portion for blocking said trigger current in order to increase a component of said trigger current toward said first and second MOS transistor arrays.

11. The semiconductor device with substrate-triggered ESD protection according to claim 10, further comprising:
    an isolation portion formed among said guard ring, said first MOS transistor array, said second MOS transistor array, said substrate-triggered portion, said first N-well, and said second N-well.

12. The semiconductor device with substrate-triggered ESD protection according to claim 11, wherein said isolation portion is an STI portion.

* * * * *